United States Patent [19]
Squibb

[11] Patent Number: 5,752,446
[45] Date of Patent: May 19, 1998

[54] ALIGNMENT SYSTEMS

[75] Inventor: Frank Norman Squibb, Weymouth, United Kingdom

[73] Assignee: DEK Printing Machines Limited, United Kingdom

[21] Appl. No.: 648,041

[22] PCT Filed: Nov. 16, 1994

[86] PCT No.: PCT/GB94/02517

§ 371 Date: May 16, 1996

§ 102(e) Date: May 16, 1996

[87] PCT Pub. No.: WO95/14575

PCT Pub. Date: Jun. 1, 1995

[30] Foreign Application Priority Data

Nov. 22, 1993 [GB] United Kingdom ............ 9323978

[51] Int. Cl.[6] .................................................. B41L 3/02
[52] U.S. Cl. .................. 101/486; 101/126; 101/127.1; 101/DIG. 36; 348/95; 348/132
[58] Field of Search ................................. 101/114, 126, 101/485, 486, 129, DIG. 86, 127.1; 348/94, 95, 132, 131

[56] References Cited

U.S. PATENT DOCUMENTS 5,060,063  10/1991  Freeman .................. 358/101
5,176,078  1/1993  Homma et al. ............ 101/126

FOREIGN PATENT DOCUMENTS

| 0259775 | 3/1988 | European Pat. Off. . |
| 3928527 | 3/1991 | Germany . |
| 4217430 | 12/1993 | Germany . |
| 1099286 | 4/1989 | Japan . |
| 2260729 | 4/1993 | United Kingdom . |

*Primary Examiner*—Ren Yan
*Attorney, Agent, or Firm*—Sheridan Ross P.C.

[57] ABSTRACT

Apparatus is provided for aligning two objects (1,2), such as a board and screen in a screen printer, each having at least one reference mark (6a,7a) on a surface thereof, whereby alignment of the objects is indicated by alignment of corresponding reference marks on the surfaces of the objects. The apparatus comprises support means for supporting the objects in use with the said surfaces facing one another, and imaging means (20), mounted for movement between the said surfaces in use, for acquiring, on a single imaging surface thereof, simultaneous images of respective areas of the surfaces of the objects, which areas contain corresponding reference marks. The apparatus includes control means (4,8) for determining the locations of the reference marks in the images and determining therefrom the extent of misalignment of the objects, and means (3), responsive to the control means, for adjusting the relative positions of the objects to bring the objects into alignment. A method for aligning two objects, and imaging means for use in aligning two objects, are also provided.

11 Claims, 5 Drawing Sheets

BOARD VIEW

SCREEN VIEW

ALIGNMENT SYSTEMS

FIELD OF THE INVENTION

This invention relates to alignment systems for use in aligning two objects in accordance with reference marks on respective surfaces of the objects. Such systems are employed, for example, in screen printers for printing solder paste onto printed circuit boards for surface mount assembly.

In screen printers for printing solder paste, a screen is positioned over a circuit board to be printed and the solder paste is applied to the board through apertures in the screen by means of a squeegee. To ensure that the solder paste is printed at the correct locations on the board for subsequent component placement, it is necessary for the screen to be aligned with the board prior to printing. This alignment needs to be performed to a greater accuracy than can be achieved by purely mechanical methods. Accordingly, the board and screen are provided with a number of corresponding reference marks, or "fiducials", such that alignment of corresponding fiducials on the board and screen indicates that the board and screen are correctly aligned, and alignment apparatus is employed to determine the relative positions of the board and screen fiducials. The position of the screen or board is then adjusted as necessary to eliminate any misalignment prior to printing.

The general arrangement of one type of alignment apparatus in a screen printer is illustrated in FIG. 1 of the accompanying drawings. In the system illustrated, a printed circuit board 1 to be printed with solder paste is supported by a base (not shown) of the printer in a generally horizontal plane parallel to the x and y axes shown in the figure. A screen 2 is supported by support means including a support frame 2a so as to lie above, and substantially parallel to, the board 1. The position of the screen 2 in the xy plane can be adjusted by means of screen positioning motors 3 the operation of which is controlled by a position controller 4. The support frame 2a and screen positioning motors 3 are mounted in a printhead portion (not shown) of the printer which can be pivoted away from the base to allow access when necessary, for example, to adjust the board support. The apparatus includes an imaging device 5 which is mounted on an XY table (not shown) for movement in a horizontal plane between the board 1 and screen 2. The position of the imaging device 5 is also controlled by the position controller 4.

The surface of the screen 2 facing the board 1 has at least two reference marks, or screen fiducials, 6a and 6b thereon. The surface of the board 1 facing the screen 2 has corresponding board fiducials 7a and 7b thereon. The positions of the board and screen fiducials are such that when each pair of corresponding fiducials 6a, 7a and 6b, 7b are in alignment, the screen is correctly aligned relative to the board for the subsequent printing operation to be performed after simply raising the board into contact with the screen. The mechanism for raising the board into contact with the screen is provided in the base of the printer.

The imaging device 5 is operated so as to acquire images of the fiducials 6, 7 and the acquired images are supplied to a vision processor 8 which is programmed to determine the locations of the fiducials in the images. The fiducial location data is then supplied to the position controller 4 for adjusting the position of the screen 2 to bring the corresponding fiducials 6a, 7a and 6b, 7b, and hence the board and screen, into alignment. A video monitor 9a allows an operator to monitor images supplied to the vision processor 8. An operator interface 9b is connected to the position controller 4 to allow operator control of the apparatus for preliminary programming and calibration purposes.

A known imaging device for use as the imaging device 5 in a system of the type described above is shown schematically in FIG. 2 of the accompanying drawings. The known imaging device, indicated generally at 10, is shown in FIG. 2 mounted between the screen 2 and board 1 in the apparatus of FIG. 1 as viewed along the +y direction. The imaging device 10 comprises a CCD camera device 11 and an optical system, indicated generally at 12, which is bounded by the dotted lines in the figure. The optical system 12 comprises a screen ring light 13 for illuminating an area of the screen 2, and a board ring light 14 for illuminating an area of the board 1. The optical system 12 includes a mechanical shutter arrangement, comprising a screen shutter 15 and a board shutter 16, the screen shutter 15 being shown in the closed position in the figure and the board shutter 16 being shown in the open position. The shutter system is switchable between the arrangement shown in the figure and an arrangement where the screen shutter 15 is open and the board shutter 16 is closed.

The optical system 12 also includes a pair of prisms 17a, 17b for receiving light reflected from either the screen 2 or board 1 depending on which of the shutters 15, 16 is open. The passage of light through the system from the ring lights 13, 14 in the two cases is indicated by the broken lines in the figure. Parallel light reflected from either the screen 2 or board 1 which emerges from the prisms 17 is incident on a telecentric lens system comprising a lens arrangement 18 and a telecentric stop 19 which transmits the light to the camera device 11 to form an image of the field of view of the board 1 or screen 2 on the CCD array forming the imaging surface of the camera device.

Thus, in the device of FIG. 2, the mechanical shutter arrangement is utilised such that, in one configuration with the board shutter 16 closed and the screen shutter 15 open, the device is arranged to view in the +z direction so as to acquire an image of the field of view of the screen 2. If the shutter arrangement is switched to close the screen shutter 15 and open the board shutter 16, the imaging device 10 views in the −z direction so as to acquire an image of the field of view of the board 1. The operation of the system of FIG. 1 using the known imaging device 10 of FIG. 2 is as follows.

The XY table on which the imaging device 10 is mounted is controlled by the position controller 4 to move the imaging device 10 to an appropriate position for acquiring images of the pair of fiducials 6a, 7a. Electromagnetic clamps (not shown) are then activated to clamp the imaging device 10 in position. With the imaging device 10 clamped in position, the position controller 4 signals the vision processor 8 to commence acquisition. Under control of the vision processor 8, the board shutter 16 is opened, and hence the screen shutter 15 closed, the board ring light 14 is activated, and the image of the board field of view containing the fiducial 7a acquired by the CCD device is transferred to the vision processor. The vision processor 8 then switches the shutter arrangement, and activates the screen light 13 to acquire an image of the field of view of the screen containing the fiducial 6a. Typical images acquired during this process are illustrated schematically in FIGS. 3a and 3b of the accompanying drawings. FIG. 3a shows the image of the field of view of the board 1 containing the board fiducial 7a, and FIG. 3b shows the image of the field of view of the screen 2 containing the screen fiducial 6a.

The images are supplied by the imaging device 10 to the vision processor 8 which is preprogrammed to identify the fiducials in the images and to determine the locations of the fiducials, in terms of numbers of pixels in the horizontal and vertical image directions, relative to the centres of the fields of view which are indicated by the intersections of the broken lines in FIGS. 3a and 3b. This fiducial location data is then supplied by the vision processor 8 to the position controller 4 which, using conversion data obtained from preliminary calibration, calculates the error in alignment of the fiducials on the board and screen for the known position of the imaging device 10. The position controller 4 then moves the imaging device to a second position so as to view the fiducials 6b and 7b, and the error in alignment for this position of the imaging device is calculated in the same way. If very high accuracy is required, and speed is less critical, further measurements using fiducials at other positions may be made.

From the alignment errors determined at the various positions of the imaging device, the position controller 4 determines the extent of misalignment of the screen 2 and board 1 and controls the screen positioning motors 3 to adjust the position of the screen 2 to bring the screen into alignment with the board. The imaging device 10 is then retracted and the board raised in the +z direction into position against the screen for the printing operation.

Prior to operation of the system as described above, the system is calibrated to obtain the conversion data required by the position controller 4 for converting measurements made on the images, in numbers of pixels, into true alignment errors for the screen and board, and for converting the alignment errors into screen movements. This is achieved by performing the three calibration functions described below which are carried out as part of the routine maintenance or repair of the printer.

The first calibration function, offset calibration, is required to determine any offset between the view of the screen and the board caused by tolerances in the mechanical assembly of the imaging device. This is achieved by using the screen to print a series of fiducials onto a blank board, and then using the alignment apparatus to measure any offset between the printed board fiducials and the screen fiducials (formed by the apertures through which the board fiducials were printed). Multiple measurements are made during the offset calibration to statistically improve the accuracy of the results.

The second calibration function, scaling calibration, is required to convert pixel data into true dimensions (i.e. actual dimensions in the plane of movement of the screen). This is achieved by positioning the imaging device to view a fiducial on the screen and making measurements of the movement of the fiducial in the image for a fixed x movement of the screen and also for a fixed y movement of the screen. Again, multiple measurements are made to statistically improve the accuracy of the results.

The third calibration function, theta calibration, is required to determine the position in the camera XY table coordinate system of the centre of rotation of the screen. This is achieved by positioning the camera to view a fiducial on the screen, and measuring the movement of the fiducial in the image for a fixed rotation of the screen, enabling the position of the camera in relation to the centre of rotation of the screen to be calculated. This is repeated for a number of different fiducial positions to accurately locate the centre of rotation.

It will be appreciated that any error in alignment of the screen and board in the system described above can result in the printed solder paste being incorrectly located on the circuit board. In the above system, it is assumed that a given pair of images of a pair of fiducials 6a, 7a or 6b, 7b correspond to a fixed position of the imaging device 10 relative to the board and screen. Thus, it is assumed that there is no movement of the imaging device 10 relative to the board and screen between acquisition of the two images. Any displacement of the imaging device relative to the board and screen between acquisition of the two images will result in an alignment error. While electromagnetic clamps are employed to clamp the imaging device in position, there is nevertheless the possibility of displacement of the imaging device between acquisition of the two images, for example due to vibration. Further, for each position of the imaging device 10, the device must be clamped in position, a first image acquired of the board (FIG. 3a), the mechanical shutter arrangement switched to change the viewing direction, and a second image acquired of the screen (FIG. 3b). This severely limits the speed with which the alignment operation can be performed, and the electromagnetic clamps and shutter arrangement complicate the apparatus and reduce overall reliability.

According to one aspect of the present invention there is provided apparatus for aligning two objects each having at least one reference mark on a surface thereof, whereby alignment of the objects is indicated by alignment of corresponding reference marks on the surfaces of the objects, the apparatus comprising:

support means for supporting the objects in use with the said surfaces facing one another;

imaging means, mounted for movement between the said surfaces in use, for acquiring, on a single imaging surface thereof, simultaneous images of respective areas of the surfaces of the objects, which areas contain corresponding reference marks;

control means for determining the locations of the reference marks in the images and determining therefrom the extent of misalignment of the objects; and means, responsive to the control means, for adjusting the relative positions of the objects to bring the objects into alignment.

With apparatus embodying the present invention, therefore, the acquired images of areas of the objects containing respective corresponding reference marks, or fiducials, correspond to the same point in time. Since the images are simultaneous, the problem with the previous system whereby alignment errors can be introduced through displacement of the imaging device between acquisition of the images is avoided. Further, since the images can be acquired simultaneously, the time required for obtaining the necessary fiducial location data at the or each position of the imaging device is reduced as compared with the previous system where the images are acquired in succession, thereby reducing the overall time required for the alignment operation. Speed of operation is further increased by eliminating the step of switching the mechanical shutter arrangement in the known system, and elimination of the shutter arrangement itself enables the system to be simplified and reliability to be improved.

Moreover, the simultaneous images are acquired on a single imaging surface of the imaging means. (For example, the simultaneous images may be formed adjacent one another on the imaging surface of the imaging means). This enables the image processing time to be reduced since, in effect, only a single image (which contains the simultaneous images of the respective views) needs to be processed for each location of the imaging device. Further, as only a single camera is required, the imaging means is not unduly complicated and problems which may arise due to, for example, scaling differences between different cameras are avoided.

Since the images are formed simultaneously it is no longer necessary to stop and clamp the imaging device at the or each position at which images are to be acquired as in the known device described above. Providing the speed of movement of the imaging device is sufficiently low as compared with the exposure time of the imaging device (as is normally the case) the simultaneous images can simply be acquired as the imaging device moves past the fiducial location. Accordingly, in a preferred embodiment of the apparatus, the control means is arranged for controlling movement of the imaging means such that, in use, the imaging means moves along a path along which the imaging means views the or each pair of corresponding reference marks, the or each pair of simultaneous images being acquired as the imaging means moves along the path. Since there is no need to stop and clamp the imaging means, the time required for the alignment operation can be further reduced, and the electromagnetic clamps can be eliminated thus further simplifying and improving the reliability of the apparatus.

The apparatus may include stroboscopic lighting means, responsive to the control means, for instantaneously illuminating the surfaces of the objects to enable the imaging means to acquire the or each pair of simultaneous images as the imaging means moves along the path. Conveniently, the imaging means includes the stroboscopic lighting means. Although two synchronised stroboscopic light sources, one for illuminating the surface of each object, may be envisaged, it is preferred that the lighting means comprises a single light source arranged for illuminating both surfaces of the objects. The provision of a common light source for illuminating both objects represents a further simplification over the known imaging device described above where, in view of the mechanical shutter arrangement, separate light sources 13 and 14 are required for the alternative views.

Although applications may be envisaged where sufficient accuracy of alignment can be achieved by processing a single pair of images showing the locations of only two reference marks, one on each object, it will usually be necessary, or at least desirable, to obtain location data from a plurality of image pairs corresponding to a plurality of pairs of reference marks. Accordingly, it is preferred that the control means is arranged for determining the extent of misalignment of the objects from the locations of a plurality of pairs of corresponding reference marks in a plurality of pairs of simultaneous images.

Where the apparatus is to be applied in aligning two objects each having at least one reference mark on a substantially planar surface thereof, such as a screen and circuit board in a screen printer, it is preferred that the support means is arranged to support the objects with the planar surfaces substantially parallel to one another, and that the imaging means is mounted for movement substantially parallel to the planar surfaces in use. While other arrangements may be envisaged, this preferred arrangement avoids unnecessary complication of the data processing operation. Similarly, though other arrangements may be envisaged, it is preferred that the imaging means is arranged to view in two substantially opposite directions so as to form, in use, simultaneous images of substantially directly opposite areas of the said surfaces of the objects.

According to another aspect of the invention there is provided a method for aligning two objects each having at least one reference mark on the surface thereof, whereby alignment of the objects is indicated by alignment of corresponding reference marks on the surfaces of the objects, the method comprising supporting the objects with the said surfaces facing one another; locating imaging means between the surfaces of the objects; acquiring simultaneous images of respective areas of the surfaces of the objects, which areas contain corresponding reference marks, on a single imaging surface of the imaging means; determining the locations of the reference marks in the images and determining therefrom the extent of misalignment of the objects; and adjusting the relative positions of the objects to bring the objects into alignment.

It is to be appreciated that, where features are described herein with reference to apparatus embodying the invention, corresponding features may be provided in accordance with a method of the invention, and vice versa.

In accordance with a further aspect of the invention there is provided imaging means for use in aligning two objects, the imaging means being arranged for viewing in a first direction and simultaneously in a second direction substantially opposite the first direction, and for acquiring simultaneous images of the fields of view in the first and second directions on a single imaging surface thereof. The imaging means may include one or more of the preferred features identified above in connection with alignment apparatus embodying the invention.

BRIEF DESCRIPTION OF THE FIGURES

A preferred embodiment of the invention will now be described, by way of example, with reference to the accompanying drawings in which.

DETAILED DESCRIPTION OF THE PREFERRED EMBODIMENTS

Figure 1:
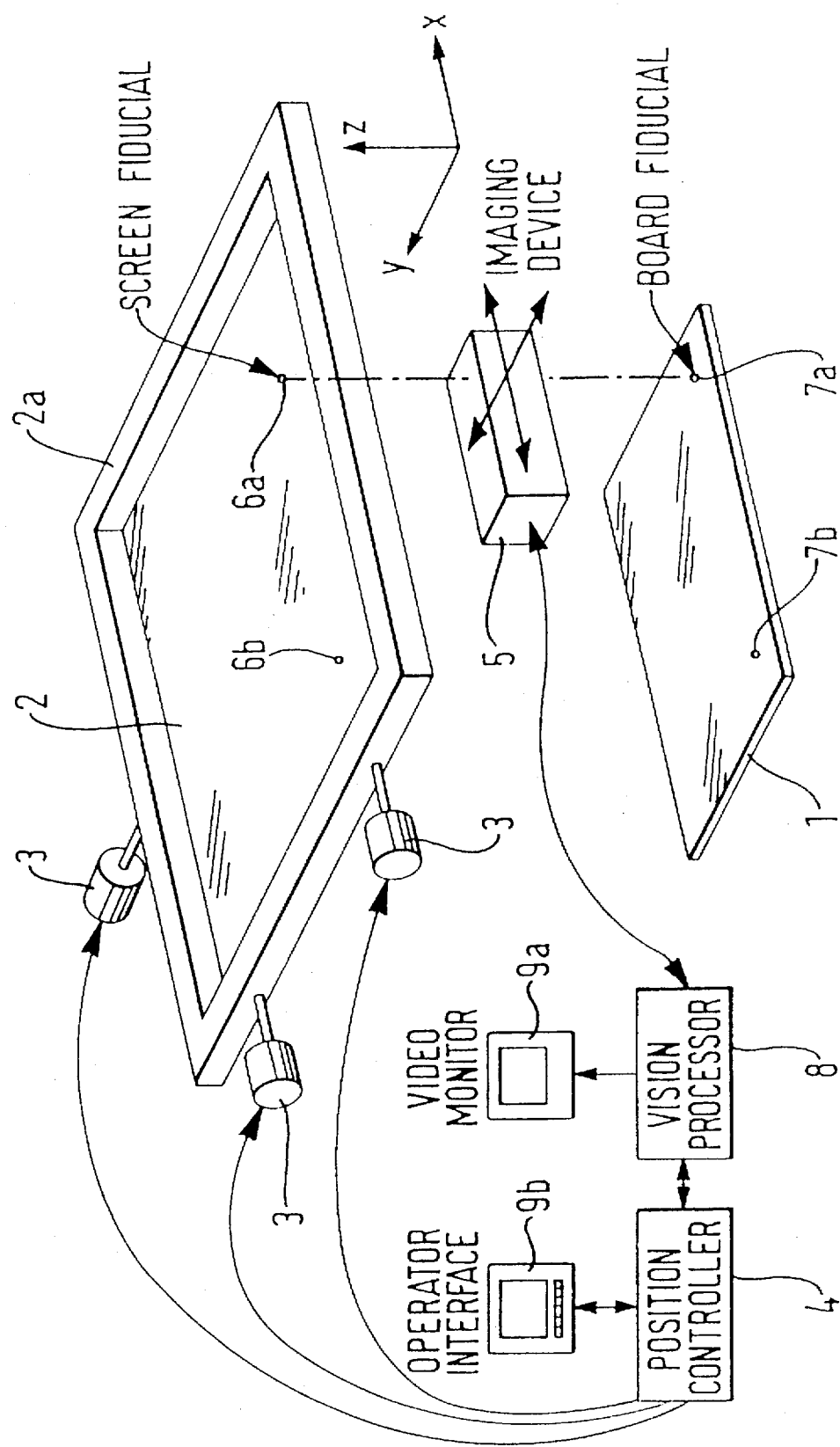
FIG. 1 is a schematic illustration of alignment apparatus for aligning a printing screen with a circuit board in a screen printer.
Figure 2:
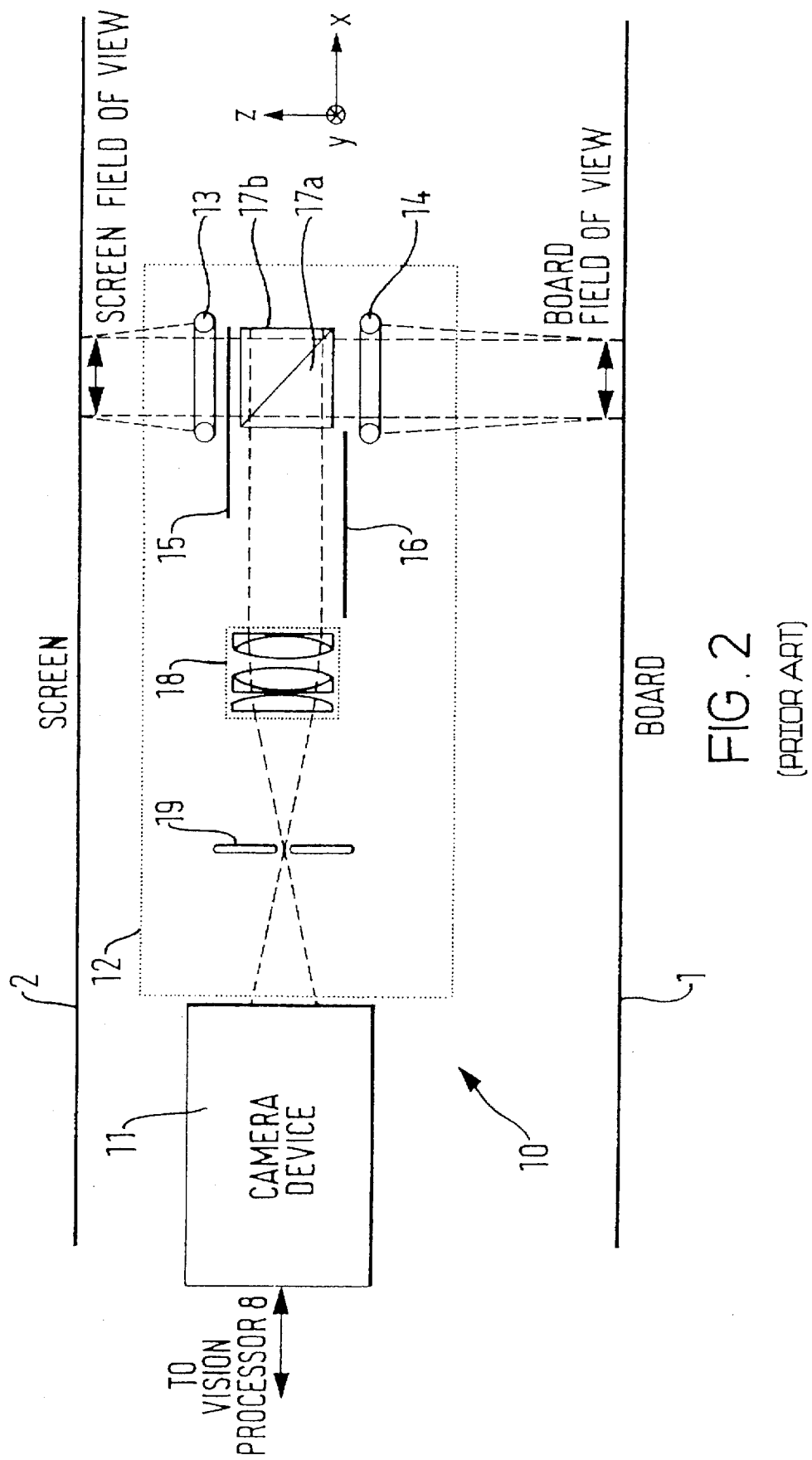
FIG. 2 is a schematic illustration of a known imaging device for use in alignment apparatus of the type shown in FIG. 1.
Figure 3A:
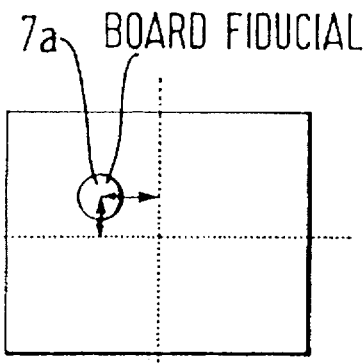
FIGS. 3a and 3b are schematic representations of images of areas of the board and screen respectively formed by the known imaging device of FIG. 2.
Figure 3B:
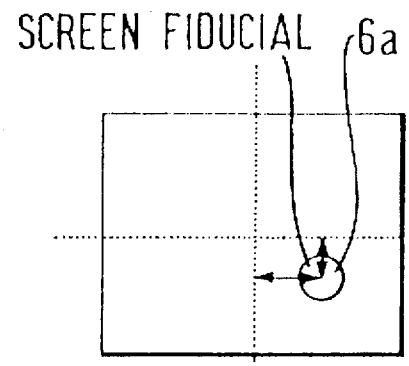
Figure 4:
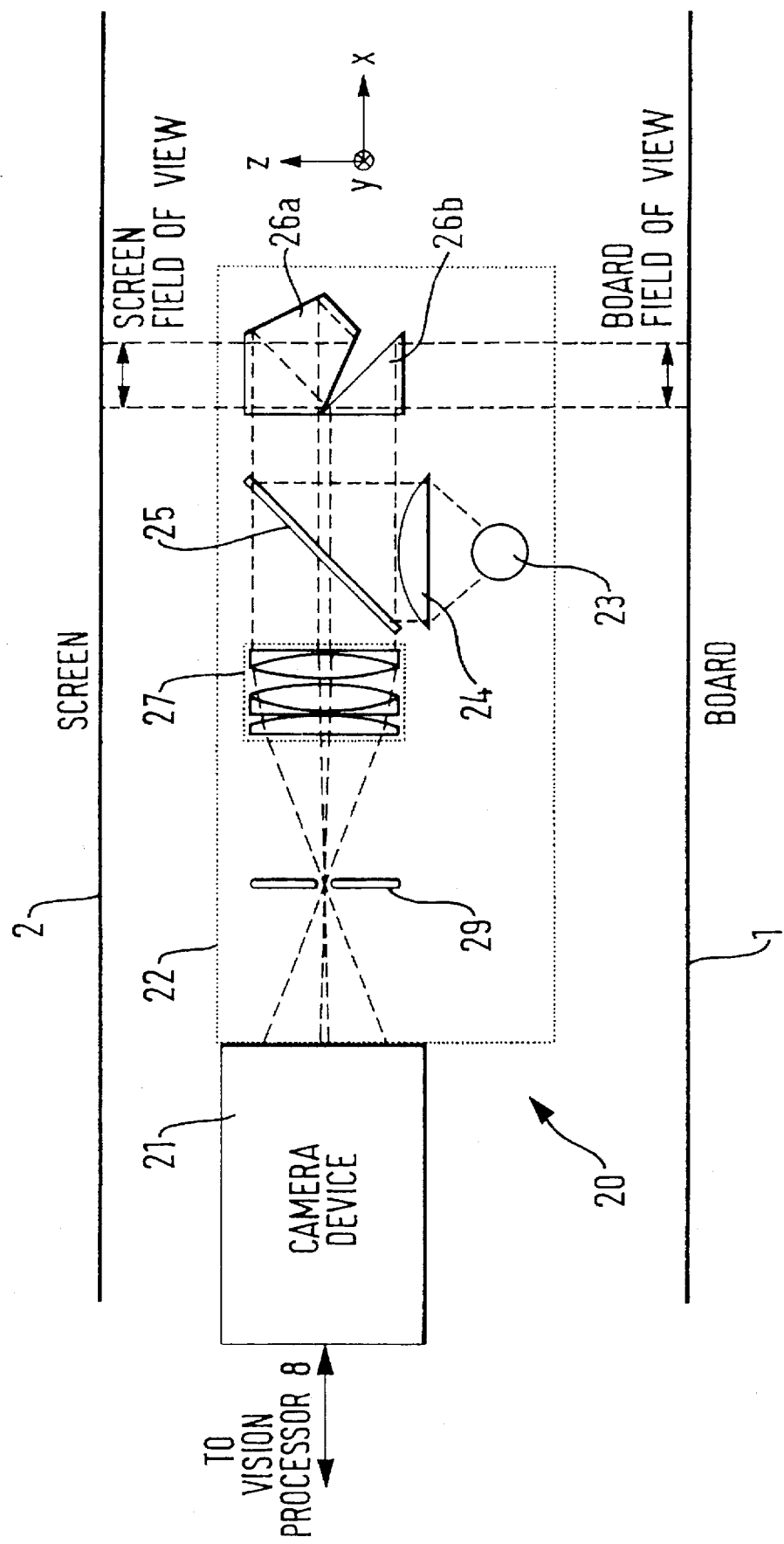
FIG. 4 is a schematic illustration of imaging means embodying the invention for use in alignment apparatus of the type shown in FIG. 1.

FIG. 4 shows imaging means in the form of an imaging device, generally indicated at 20, which can be used as the imaging device 5 in alignment apparatus of the type shown in FIG. 1. FIG. 4 shows the imaging device 20 between the screen 2 and board 1 in the apparatus of FIG. 1 as viewed along the +y direction.

The imaging device 20 comprises a camera device 21, preferably a CCD camera device, and an optical system, indicated generally at 22, which is bounded by the dotted lines in the figure. The optical system 22 comprises a stroboscopic light source 23 for illuminating the board and screen. The passage of light from the light source 23 through the optical system 22 is indicated by the broken lines in the figure. The light source 23 is positioned at the focal point of a lens 24 so that parallel light from the lens 24 is incident on a reflection/transmission plate 25. Incident light from the lens 24 is reflected by the plate 25 into two prisms 26a and 26b. Light incident on the prism 26a is reflected from the internal surfaces of the prism so as to emerge as parallel light in the +z direction perpendicular to the plane of the screen 2. Light incident on the prism 26b is reflected off an internal surface thereof so as to emerge as parallel light in the −z direction perpendicular to the board 1. Reflected light from the screen 2 and board 1 received by the prisms 26a and 26b follows directly opposite return paths through the prisms and passes directly through the reflection/transmission plate 25. The parallel light transmitted through the plate 25 is incident on a telecentric lens system comprising the lens arrangement 27 and the telecentric stop 29 which transmits the light to the camera device 21 in such a manner that separate images of the screen and board fields of view are formed on the CCD array forming the imaging surface of the camera device. The images are formed adjacent one another on the imaging surface so that a single image acquired by the camera device 21 consists of adjacent images of the screen and board fields of view.

Thus, in the imaging device of FIG. 4, the optical system 22 is arranged to receive light reflected simultaneously from the screen 2 and board 1, and to transmit the light to the CCD device 21 substantially without "overlap", or interference, of the screen and board reflected light, whereby simultaneous images of the screen and board fields of view are formed side by side on the CCD array. As illustrated in the figure, the optical system 22 is offset towards the screen 2 to account for the longer path length of light through the prism 26a, corresponding to the screen image, than that of light through the prism 26b corresponding to the board image.

When the imaging device 20 is used in the system of FIG. 1, the vision processor 8 is preprogrammed in the same way as for the known device described above to recognise fiducials in images acquired by the imaging device. This preprogramming is carried out in known manner by an operator who can view images acquired by the imaging device on the video monitor 9a, and can program the vision processor 8 accordingly via the operator interface 9b. Also as in the known system, prior to operation in the alignment mode, conversion data must be acquired to enable the position controller 4 to convert measurements made on the images, in numbers of pixels, into true alignment errors for the screen and board, and to convert the alignment errors into screen movements. This calibration data is obtained by performing the same calibration functions as for the known system described earlier. However, in the offset calibration stage in this case, the vision processor determines the spacing, in terms of numbers of pixels in the horizontal and vertical image directions, between the two fiducials in an acquired image. This provides a composite offset which includes any inherent offset in the screen and board fields of view due to tolerances in the imaging device, and the offset between the centres of the simultaneous images due to the images being side by side in the single image acquired by the CCD array.

Following the calibration procedure, the apparatus can be used to align a screen and a board to be printed, the screen and board having a plurality of pairs of corresponding fiducials 6a, 7a and 6b, 7b as illustrated in FIG. 1. The fiducials 6, 7 are at standard locations on the screen 2 and board 1 and the approximate positions of the fiducials relative to the camera XY table are pre-stored in the position controller 4. With the screen 2 and board 1 positioned parallel to one another and to the plane of movement of the imaging device 20 ready for the alignment operation as shown in FIG. 1, the screen, board and imaging device are substantially enclosed within the printer so that there is little ambient light. Under control of the position controller 4, the imaging device 20 is moved on the XY table along a path which takes it through each of the pre-stored fiducial locations. That is to say, as the imaging device 20 is moved along the path, the screen and board fields of view (as indicated in FIG. 4) will pass over each corresponding pair of screen and board fiducials. As the imaging device reaches each fiducial location, the position controller 4 signals the vision processor 8 that acquisition should occur, and the vision processor 8 then triggers the stroboscopic light 23 to instantaneously illuminate the fields of view. The resulting image projected onto the CCD array is then transferred to the vision processor 8.

Figure 5:
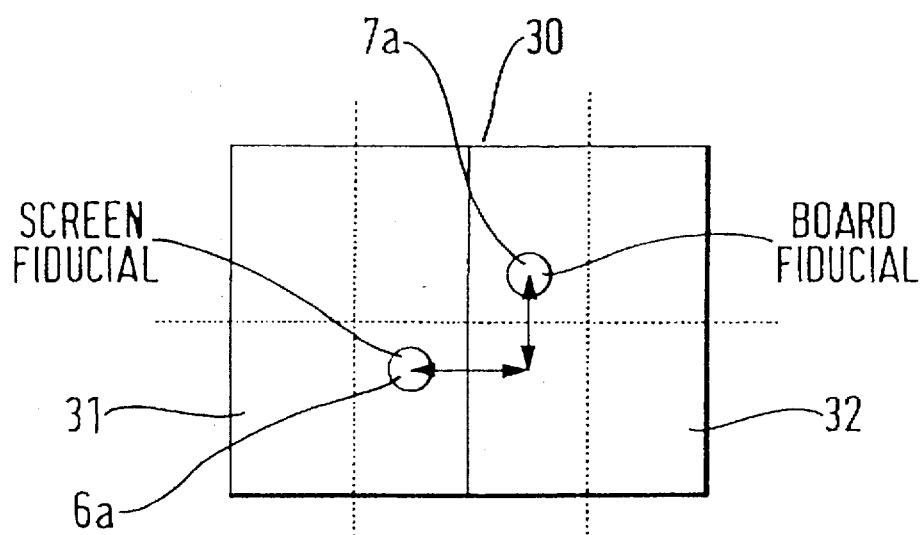
FIG. 5 is a schematic illustration of an image acquired by the imaging means of FIG. 4, the image comprising simultaneous images of areas of the board and screen.

Thus, at the location of each fiducial pair, simultaneous images of the screen and board fields of view are acquired as a single image on the CCD array without the need to stop and clamp the imaging device in position. FIG. 5 illustrates an example of such an image for a fiducial pair 6a, 7a. The complete image 30 acquired by the camera device is split vertically into two sections, the left hand section being the image 31 of the screen field of view, including the fiducial 6a, and the right hand section being the image 32 of the board field of view, including the fiducial 7a. For each such image 30, the vision processor 8 identifies the images of the fiducials 6a and 7a, and determines the locations of the fiducials, in terms of numbers of pixels in the horizontal and vertical image directions, relative to one another.

For each image 30, the fiducial location data is supplied by the vision processor 8 to the position controller 4 which compares the data with the offset measured during offset calibration, to determine the actual offset due to misalignment at that position, and calculates the actual alignment error of the screen relative to the board at that position using the predetermined conversion data. From the alignment error at each fiducial location, the position controller 4 calculates the overall extent of misalignment of the screen 2 and board 1. The position controller 4 then activates the screen positioning motors 3 as necessary to move the screen 2 into alignment with the board 1.

With the screen 2 fully aligned with the board 1, the XY table on which the imaging device 20 is mounted is operated by the position controller 4 to retract the imaging device 20 from between the board and screen. The mechanism in the base of the printer is then activated to raise the board vertically (in the +z direction) into position against the screen, and the printing operation can commence.

The operation of the position controller 4 and vision processor 8 in both the embodiment of the invention described above and the known system described earlier is controlled by appropriate software. The minor modifications to the known software required for operation of the alignment apparatus with the imaging device 20 embodying the invention will be apparent to those skilled in the art from the above description.

In the embodiment of the invention described above, the acquisition of simultaneous images at each fiducial location avoids the possibility of alignment errors being introduced as in the known system due to displacement of the imaging device between acquisition of successive images. The simultaneous image acquisition also reduces the time required for operation of the apparatus, and this time is further reduced by acquisition of the simultaneous images as the imaging device moves along a predetermined path. Moreover, in effect only a single image 30 (formed of simultaneous images of the board and screen fields of view) needs to be processed for each fiducial pair location. In addition, the elimination of the mechanical shutter system and electromagnetic clamps of the known apparatus, and the use of a single light source 23 to illuminate both fields of view, results in substantial simplification of the apparatus and an overall improvement in reliability.

Figure 6:
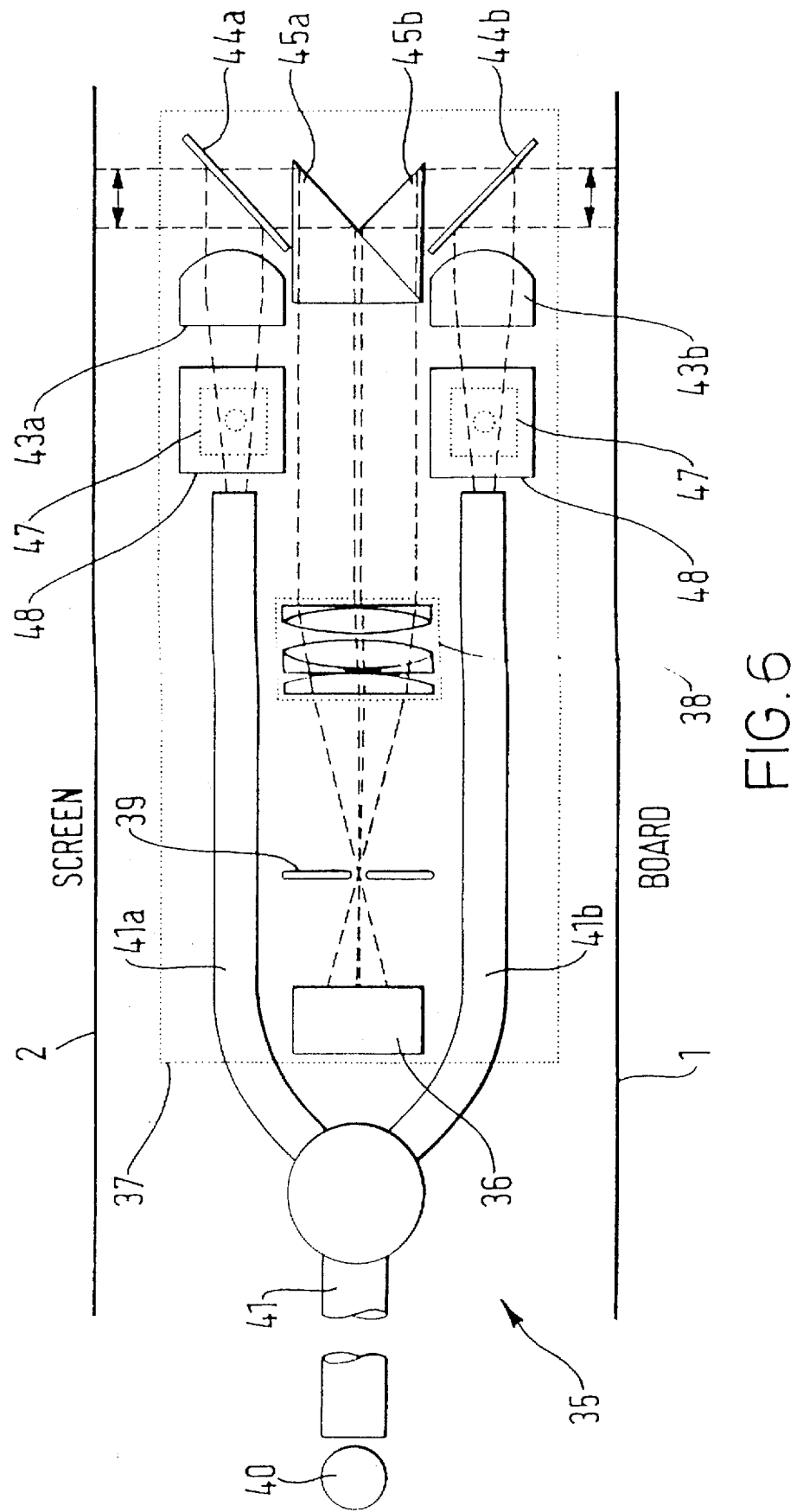
FIG. 6 is a schematic illustration of a further embodiment of imaging means for use in alignment apparatus of the type shown in FIG. 1.

FIG. 6 shows a further example of imaging means embodying the invention, the imaging means being indicated generally by the reference numeral 35. Again, the imaging device 35 can be used as the imaging device 5 in alignment apparatus of the type shown in FIG. 1. In FIG. 6, the imaging device 35 is shown between the screen 2 and board 1 in the apparatus of FIG. 1 as viewed along the +y direction.

The imaging device 35 comprises a camera device 36, preferably a CCD camera, and an optical system, indicated generally at 37, which is bounded by the dotted lines in the figure. In this embodiment, the CCD camera 36 is built into the optical system 37 to provide a smaller, stronger module. The optical system 37 again includes a telecentric lens system comprising a lens arrangement 38 and telecentric stop 39 which are the same as those in the embodiment of FIG. 4. In this embodiment, however, light from a single stroboscopic light source, here a xenon lamp 40, is transmitted via a bifurcated fibre optic cable 41, having branches 41a and 41b, to a screen lens 43a and a board lens 43b.

The passage of light from the ends of the branches 41a, 41b of the fibre optic cable through the optical system to the camera 36 is indicated by the broken lines in the figure. As shown, light from the fibre optic branch 41a is transmitted by the screen lens 43a and then reflected by a reflection/transmission plate 44a so as to impinge on the screen 2. Similarly, light from the fibre optic branch 41b is transmitted by the board lens 43b and then reflected by a further reflection/transmission plate 44b so as to impinge on the board 1. The screen and board fields of view are again indicated schematically by the double headed arrows in the figure. Light reflected back from the screen 2 and board 1 passes directly through the plates 44a and 44b respectively and is incident upon a prism arrangement comprising prisms 45a and 45b. Reflected light from the screen 2 is reflected by an internal surface of the prism 45a to be incident on the telecentric lens system 38, 39 and transmitted thereby to the camera 36 as illustrated. Similarly, reflected light from the board 1 is reflected by an internal surface of the prism 45b, passes through the prism 45a, and is transmitted by the telecentric lens system to the camera 36 as illustrated. As before, separate images of the screen and board fields of view are formed on the CCD array forming the imaging surface of the camera 36. The images are formed adjacent one another, so that a single image acquired by the camera 36 consists of adjacent images of the screen and board fields of view.

Thus, the basic principle of operation of the imaging device 35 is the same as that of the embodiment of FIG. 4 described above, the optical system 37 being arranged to receive light reflected simultaneously from the screen 2 and board 1, and to transmit to the light to the camera 36 substantially without overlap of the screen and board reflected light, whereby simultaneous images of the screen and board fields of view are formed side-by-side on the CCD array. In this embodiment, however, the prism arrangement 45a, 45b is simpler than that in the FIG. 4 embodiment allowing a reduction in the cost of the module. Also, the introduction of light through two separate lenses 43a, 43b and associated reflection/transmission plates 44a, 44b in this arrangement reduces the possibility of light from the stroboscopic light source being reflected directly back into the camera, so that the image quality can be improved. This arrangement has an added advantage in that the cone angle of illumination of the screen and board is improved. For the sake of simplicity, light reflected from the plates 44a, 44b onto the screen 2 and board 1 is indicated as parallel light in the Figure. In fact, however, with the arrangement of FIG. 6 there will be a slight divergence in light reflected from the plates 44a, 44b to produce a cone of light in each case. This has the advantage that diffused as well as directly reflected light is transmitted back into the optical system, and this has been found to provide a further improvement in image quality.

A further modification in the embodiment of FIG. 6 is that two secondary light sources are provided in the form of LED's 47 to provide continuous lighting during set-up. The LED's 47 are each mounted on one side of a beam-splitting cube 48 located between the corresponding branch 41a, 41b of the fibre optic cable and the corresponding lens 43a, 43b. The beam-splitting cubes 48 are arranged to transmit either light from the xenon lamp 40 or light from the associated LED 47 to the lens 43a or 43b to illuminate the screen or board. The LED's 47 can be activated by the vision processor when required to facilitate set-up procedures, but are switched off during normal operation when light is provided by the xenon lamp 40 for alignment operations.

Operation of the system with the imaging device 35 of FIG. 6 is the same as that previously described for the embodiment of FIG. 4, the imaging device being moved between the screen 2 and board 1, the vision processor 8 activating the xenon lamp 40 at the fiducial pair locations along the path of movement to instantaneously illuminate the fields of view, and the image projected onto the CCD array being transferred to the vision processor 8. The vision processor 8 again identifies the locations of the fiducials in the images and, from the alignment error at each fiducial pair location, the position controller 4 determines the overall misalignment of the screen and board and activates the screen positioning motors 3 to correct this. Although with the optical arrangement of FIG. 6 the screen image is not reversed to match the board image as is the case with the embodiment of FIG. 4, this can be accounted for by minor modification of the data processing algorithms implemented during the calibration and measurement operations as will be readily apparent to those skilled in the art.

It will of course be appreciated that many variations and modifications may be made to the specific embodiments described above without departing from the scope of the invention.

What is claimed is:

1. Apparatus for aligning two objects each having at least one reference mark on a surface thereof, whereby alignment of the objects is indicated by alignment of corresponding reference marks on the surfaces of the objects, the apparatus comprising:

support means for supporting the objects in use with the said surfaces facing one another;

imaging means, mounted for movement between the said surfaces in use, for acquiring, on a single imaging surface thereof, simultaneous images of respective areas of the surfaces of the objects, which areas contain corresponding reference marks;

control means for determining the locations of the reference marks in the images and determining therefrom the extent of misalignment of the objects, the control means being arranged for controlling movement of the imaging means such that, in use, the imaging means moves along a path along which the imaging means views the or each pair of corresponding reference marks, the or each pair of simultaneous images being acquired as the imaging means moves along the path;

stroboscopic lighting means, responsive to the control means, for instantaneously illuminating the surfaces of the objects to enable the imaging means to acquire the or each pair of simultaneous images as the imaging means moves along the path; and means, responsive to the control means, for adjusting the relative positions of the objects to bring the objects into alignment.

2. Apparatus as claimed in claim 1, wherein the lighting means comprises a single light source arranged for illuminating both surfaces of the objects.

3. Apparatus as claimed in claim 1 or claim 2, wherein the control means is arranged for determining the extent of misalignment of the objects from the locations of a plurality of pairs of corresponding reference marks in a plurality of pairs of simultaneous images.

4. Apparatus as claimed in claim 1 for aligning two objects each having at least one reference mark on a substantially planar surface thereof, wherein the support means is arranged to support the objects with the planar surfaces substantially parallel to one another, and that the imaging means is mounted for movement substantially parallel to the planar surfaces in use.

5. Apparatus as claimed in claim 4, wherein the imaging means is arranged to view in two substantially opposite directions so as to form, in use, simultaneous images of substantially directly opposite areas of the said surfaces of the objects.

6. Apparatus as claimed in claim 1, wherein the simultaneous images are formed adjacent one another on the imaging surface of the imaging means.

7. Apparatus as claimed in claim 1 for aligning a printing screen with a circuit board to be printed.

8. Apparatus as claimed in claim 7, wherein the means for adjusting the relative positions of the board and screen is arranged to adjust the absolute position of the screen.

9. A screen printer including apparatus as claimed in claim 1.

10. Imaging means for use in aligning two objects, the imaging means being mounted for movement between the objects and arranged for viewing in a first direction and simultaneously in a second direction substantially opposite the first direction, and for acquiring simultaneous images of the fields of view in the first and second directions on a single imaging surface thereof, the imaging means including stroboscopic lighting means for instantaneously illuminating said fields of view, wherein the imaging means acquires said simultaneous images as the imaging means moves relative to the objects.

11. A method for aligning two objects each having at least one reference mark on the surface thereof, whereby alignment of the objects is indicated by alignment of corresponding reference marks on the surfaces of the objects, the method comprising supporting the objects with the said surfaces facing one another; locating imaging means between the surfaces of the objects; moving the imaging means along a path along which the imaging means views the or each pair of corresponding reference marks; instantaneously illuminating the surfaces of the objects and acquiring simultaneous imagines of respective areas thereof, which areas contain corresponding reference marks, on a single imaging surface of the imaging means as the imaging means moves along the path; determining the locations of the reference marks in the images and determining therefrom the extent of misalignment of the objects; and adjusting the relative positions of the objects to bring the objects into alignment.

* * * * *